(12) United States Patent
Zhao et al.

(10) Patent No.: US 9,735,797 B2
(45) Date of Patent: Aug. 15, 2017

(54) DIGITAL MEASUREMENT OF DAC TIMING MISMATCH ERROR

(71) Applicant: ANALOG DEVICES, INC., Norwood, MA (US)

(72) Inventors: Jialin Zhao, Santa Clara, CA (US); Qingdong Meng, Belmont, MA (US); Yunzhi Dong, Weehawken, NJ (US); Jose Barreiro Silva, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/360,349

(22) Filed: Nov. 23, 2016

(65) Prior Publication Data

US 2017/0170839 A1    Jun. 15, 2017

Related U.S. Application Data

(60) Provisional application No. 62/267,368, filed on Dec. 15, 2015.

(51) Int. Cl.
*H03M 1/00* (2006.01)
*H03M 1/10* (2006.01)
(Continued)

(52) U.S. Cl.
CPC .......... *H03M 1/1071* (2013.01); *H03M 1/46* (2013.01); *H03M 3/464* (2013.01)

(58) Field of Classification Search
CPC ...... H03M 1/1071; H03M 3/464; H03M 1/46; H03M 1/001; H03M 1/167
(Continued)

(56) References Cited

U.S. PATENT DOCUMENTS

| 4,996,530 A | 2/1991 | Hilton |
| 6,930,626 B2 * | 8/2005 | Brooks ................. H03M 1/067 341/118 |

(Continued)

FOREIGN PATENT DOCUMENTS

EP    2930849    10/2015

OTHER PUBLICATIONS

Notice of Allowance (1st Action) issued in U.S. Appl. No. 15/360,617 dated Mar. 10, 2017.
(Continued)

*Primary Examiner* — Jean B Jeanglaude
(74) *Attorney, Agent, or Firm* — Patent Capital Group

(57) ABSTRACT

For analog-to-digital converters (ADCs) which utilize a feedback digital-to-analog converter (DAC) for conversion, the final analog output can be affected or distorted by errors of the feedback DAC. A digital measurement technique can be implemented to determine timing mismatch error for the feedback DAC in a continuous-time delta-sigma modulator (CTDSM) or in a continuous-time pipeline modulator. The methodology utilizes cross-correlation of each DAC unit elements (UEs) output to the entire modulator output to measure its timing mismatch error respectively. Specifically, the timing mismatch error is estimated using a ratio based on a peak value and a value for the next tap in the cross-correlation function. The obtained errors can be stored in a look-up table and fully corrected in digital domain or analog domain.

20 Claims, 8 Drawing Sheets

(51) Int. Cl.
H03M 1/46 (2006.01)
H03M 3/00 (2006.01)

(58) Field of Classification Search
USPC .................................. 341/118, 155, 144, 110
See application file for complete search history.

(56) References Cited

U.S. PATENT DOCUMENTS

| | | | |
|---|---|---|---|
| 7,983,320 B2* | 7/2011 | Fullerton | H04B 1/69 375/130 |
| 8,031,098 B1 | 10/2011 | Ebner et al. | |
| 9,543,974 B1 | 1/2017 | Yang | |
| 2004/0156432 A1 | 8/2004 | Hidaka | |

OTHER PUBLICATIONS

Muhammed Bolatkale et al., A 4GHz CT ΔΣ ADC with 70dB DR and -74dBFS THD in 125MHz BW, ISSCC 2011 / Session 27 / Oversampling Converters / 27.1, 2011 IEEE International Solid-State Circuits Conference, 978-1-61284-302-5/11 © 2011 IEEE, 3 pages.
Hajime Shibata et al., A DC-to-1 GHz Tunable RF ΔΣ ADC Achieving DR=74 dB and BW=150 MHz at f0=450 MHz Using 550 mW, © 2012 IEEE, 10 pages.
Yunzhi Dong et al., A 235mW CT 0-3 MASH ADC Achieving -167dBFS/Hz NSD with 53MHz BW, ISSCC 2014 / Session 29 / Data Converters for Wireless Systems / 29.2, © 2014 IEEE International Solid-State Circuits Conference, 3 pages.
Do-Yeon Yoon et al., An 85dB-DR 74.6dB-SNDR 50MHz-BW CT MASH ΔΣ Modulator in 28nm CMOS, ISSCC 2015 / Session 15 / Data-Converter Techniques / 15.1, 2015 IEEE International Solid State Circuits Conference © 2015 IEEE, 3 pages.
Craig Petrie et al., A Background Calibration Technique for Multibit Delta-Sigma Modulators, ISCAS 2000—IEEE International Symposium on Circuits and Systems, May 28-31, 2000, Geneva, Switzerland, 4 pages.
Pascal Witte et al., A Background DAC Error Estimation in Sigma-Delta ADCs Using a Pseudo Random Noise Based Correlation Technique, 978-1-4244-3828-0 © 2009 IEEE, 4 pages.
Pascal Witte et al., Background DAC Error Estimation Using a Psuedo Random Noise Based Correlation Technique for Sigma-Delta Analog-to-Digital Converters, IEEE Transactions on Circuits and Systems—I: Regular Papers, vol. 57, No. 7, Jul. 2010, 13 pages.
John G. Kauffman et al., An 8mW 50MS/s Ct ΔΣ Modulator with 81dB SFDR and DigitalBackground DAC Linearization, ISSCC 2011 / Session 27 / Oversampling Converters / 27.2, 3 pages.
Pascal Witte et al., A Correlation-Based Background Error Estimation Technique for Bandpass Delta-Sigma ADC DACs, IEEE Transactions on Circuits and Systems—II: Express Briefs, vol. 58, No. 11, Nov. 2011, 5 pages.
Pascal Witte et al., An Error Estimation Technique for Lowpass and Bandpass ΔΣ Feedback DACs Using a Residual Test Signal, 978-1-4673-0219-7/12 © 2012 IEEE, 4 pages.
John G. Kauffman et al., An 8.5 mW Continuous-Time ΔΣ Modulator with 25 MHz Bandwidth Using Digital Background DAC Linearization to Achieve 63.5 dB SNDR and 81 dB SFDR, IEEE Journal of Solid-State Circuits, vol. 46, No. 12, Dec. 2011, 13 pages.
Susan Luschas et al., High Speed ΣΔ , Modulators with Reduced Timing Jitter Sensitivity, IEEE Transactions on Circuits and Systems—II: Analog and Digital Signal Processing, vol. 49, No. 11, Nov. 2002, 9 pages.
Yongjian Tang et al., A 14 bit 200 MS/s DAC with SFDR >78 dBc, IM3 < -83 dBc and NSD < -163 dBm/Hz Across the Whole Nyquist Band Enabled by Dynamic-Mismatch Mapping, IEEE Journal of Solid-State Circuits, vol. 46, No. 6, Jun. 2011, 11 pages.
Hans Van de Vel et al., A 240mW 166 3.2GS/s DAC in 65nm CMOS with <-80dBc IM3 up to 600MHz, ISSCC 2014 / Session 11 / Data Converter Techniques / 11.7, 3 pages.
Benjamin Jankunas, Design and Calibration of a 12-Bit Current-Steering DAC Using Data-Interleaving, A Thesis presented to Graduate Supervisory Committee, Arizona State University, Dec. 2014, 71 pages.
EP Search Report issued in EP Patent Application Serial No. 16203251.0 mailed May 15, 2017, 10 pages.

* cited by examiner

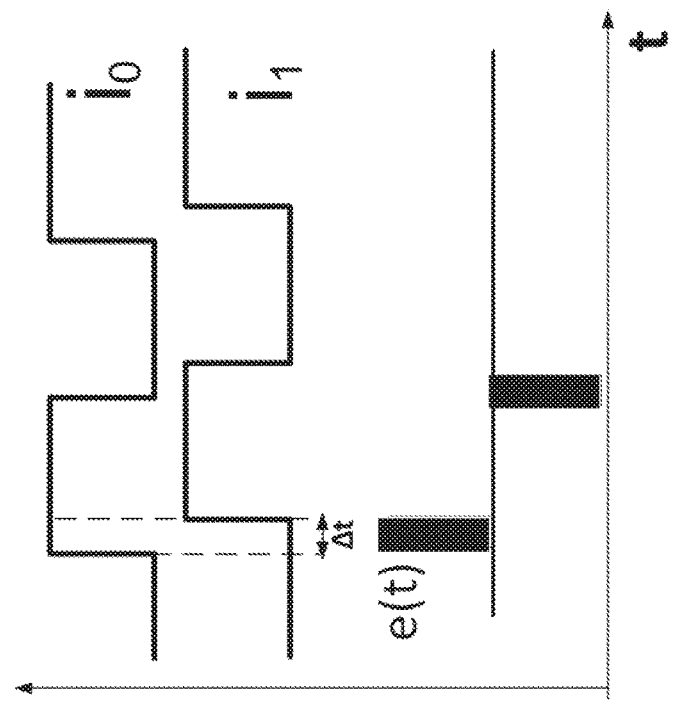
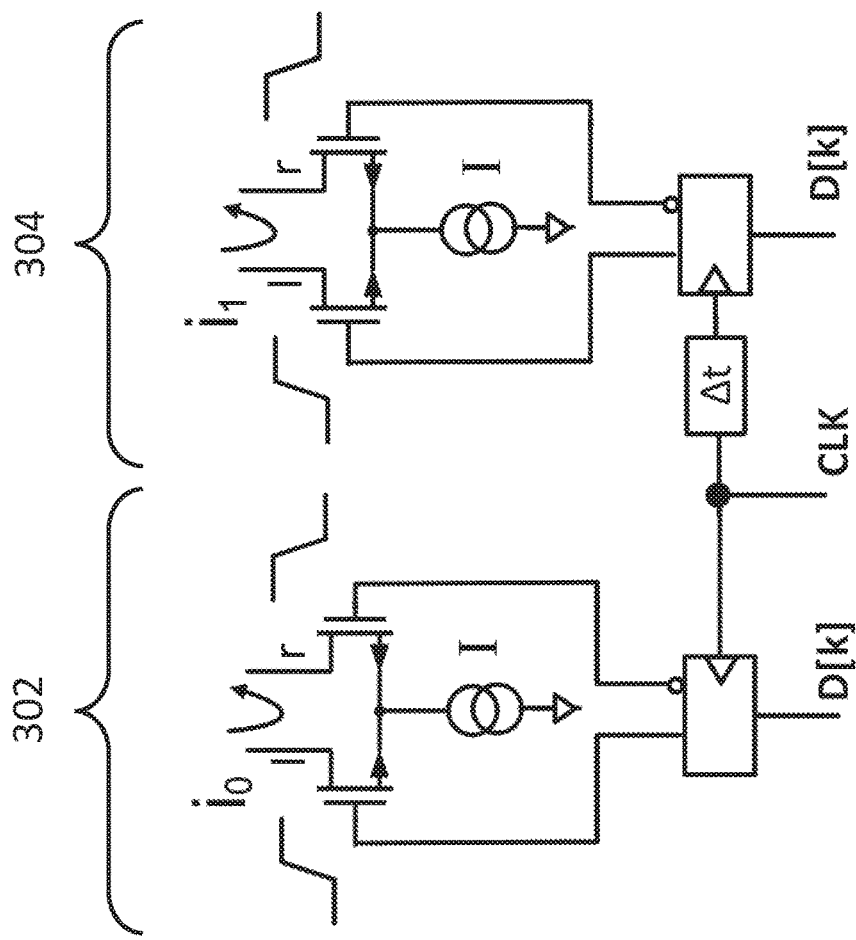
FIGURE 3B
FIGURE 3A

DIGITAL MEASUREMENT OF DAC TIMING MISMATCH ERROR

PRIORITY DATA

This is a non-provisional patent application receiving benefit from US Provisional Patent Application, entitled, DIGITAL MEASUREMENT OF DAC TIMING MISMATCH ERROR (filed on Dec. 15, 2015, Ser. No. 62/267,368). The US Provisional Patent Application is hereby incorporated by reference in its entirety.

TECHNICAL FIELD OF THE DISCLOSURE

The present disclosure relates generally to analog-to-digital converters (ADCs) and, more particularly, to digital measurement of digital-to-analog converter timing mismatch error in a delta sigma modulator or pipeline modulator.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 3A shows two current steering DAC elements having timing path difference, according to some embodiments of the disclosure;

FIG. 3B illustrates error charges e(t) delivered due to timing skew, according to some embodiments of the disclosure;

DESCRIPTION OF EXAMPLE EMBODIMENTS OF THE DISCLOSURE

For analog-to-digital converters (ADCs) which utilize a feedback digital-to-analog converter (DAC) for conversion, the final analog output can be affected or distorted by errors of the feedback DAC. A digital measurement technique can be implemented to determine timing mismatch error for the feedback DAC in a continuous-time delta-sigma modulator (CTDSM) or in a continuous-time pipeline modulator. The methodology utilizes cross-correlation of each DAC unit elements (UEs) output to the entire modulator output to measure its timing mismatch error respectively. Specifically, the timing mismatch error is estimated using a ratio based on a peak value and a value for the next tap in the cross-correlation function. The obtained errors can be stored in a look-up table and fully corrected in digital domain or analog domain.

Design Considerations for Analog to Digital Converters: Error from Feedback DAC

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
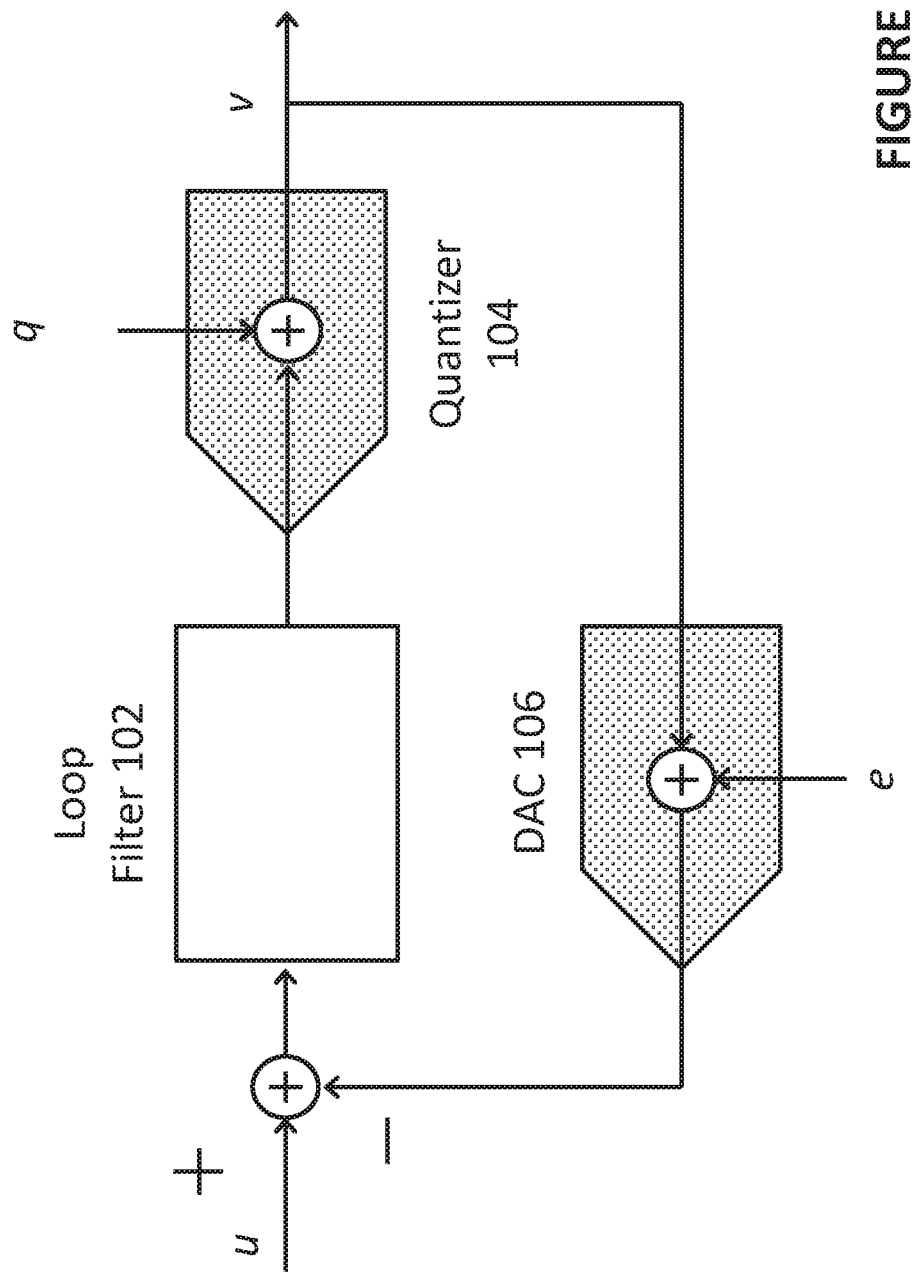
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

The feedback DAC 106 is typically in a feedback configuration with an analog-to-digital converter (ADC). That is, the digital output of the ADC "v" is fed to the input of the feedback DAC 106, and the output of the feedback DAC is fed back to the input path of the ADC. Generally speaking, the feedback DAC 106 is a multi-bit DAC which is implemented with a plurality of unit elements that are controlled by input bits to the feedback DAC. Each one of the unit elements, e.g., current steering cells, generate from the input digital code v fed to the feedback DAC 106 a part of analog output signal of the feedback DAC. In some cases, these unit elements are referred to as DAC elements which make up the feedback DAC 106. The DAC elements are, in some cases, referred to as unit elements because to the current steering circuits are ideally steering the same amount of current to the output (i.e., the DAC elements are weighted the same or have the same weight).

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog output. In some cases, the stages receive different analog inputs. For instance, some MASH ADCs have a front-end and a back-end where inputs to each modulator differ. Some MASH ADCs have stages where the implementation of the stage may differ. MASH ADCs address the issue of unstability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta sigma modulators) for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

The feedback digital-to-analog converter (e.g., DAC 106 of FIG. 1) is, in some cases, not ideal. Although the DS ADC, in particular, the loop filter, is able to shape the noise from the quantizer 104, the DS ADC does not correct for nor shape the error e from the feedback DAC 106. As a result, the error e from DAC 106 shows up at the digital output v. In other words, without further modifications to the DS ADC, the DS ADC may require the feedback DAC to be as good as the overall DS ADC. This same issue is present for MASH ADCs, and even pipeline modulators. For instance, a MASH ADC sometimes has challenges in adequately correcting errors from the feedback DAC in the DS ADC at any of the stages.

In a continuous-time MASH ADC (MASH ADC implemented using continuous time circuitry), the analog input is converted to a sequence of digital code that approximates the spectrum of the input closely in a narrow band, while the quantization error is shaped away. To achieve better Signalto-Quantization-Noise Ratio (SQNR), a multi-bit continuous-time delta sigma modulator is used due to its smaller quantization step and feasibility of higher out of band gain. Unfortunately the usage of multi-bit quantizer also requires a multi-bit DAC in the feedback path. The feedback DAC nonlinearities, i.e., represented by the error e seen in FIG. 1, add directly to the input signal and are not noise-shaped. Therefore, the feedback DAC nonlinearity needs to be as good as the resolution of the modulator itself. For this reason, one of the critical goals in the design of multi-bit delta-sigma ADCs is to reduce the impact that the limited linearity in the main feedback DAC has on the overall ADC performance (i.e., to correct or alleviate issues caused by the error introduced by the main feedback DAC). In other words, the errors in the feedback DAC may need to be measured and calibrated to ensure sufficient linearity and performance of the MASH ADC.

Figure 2:
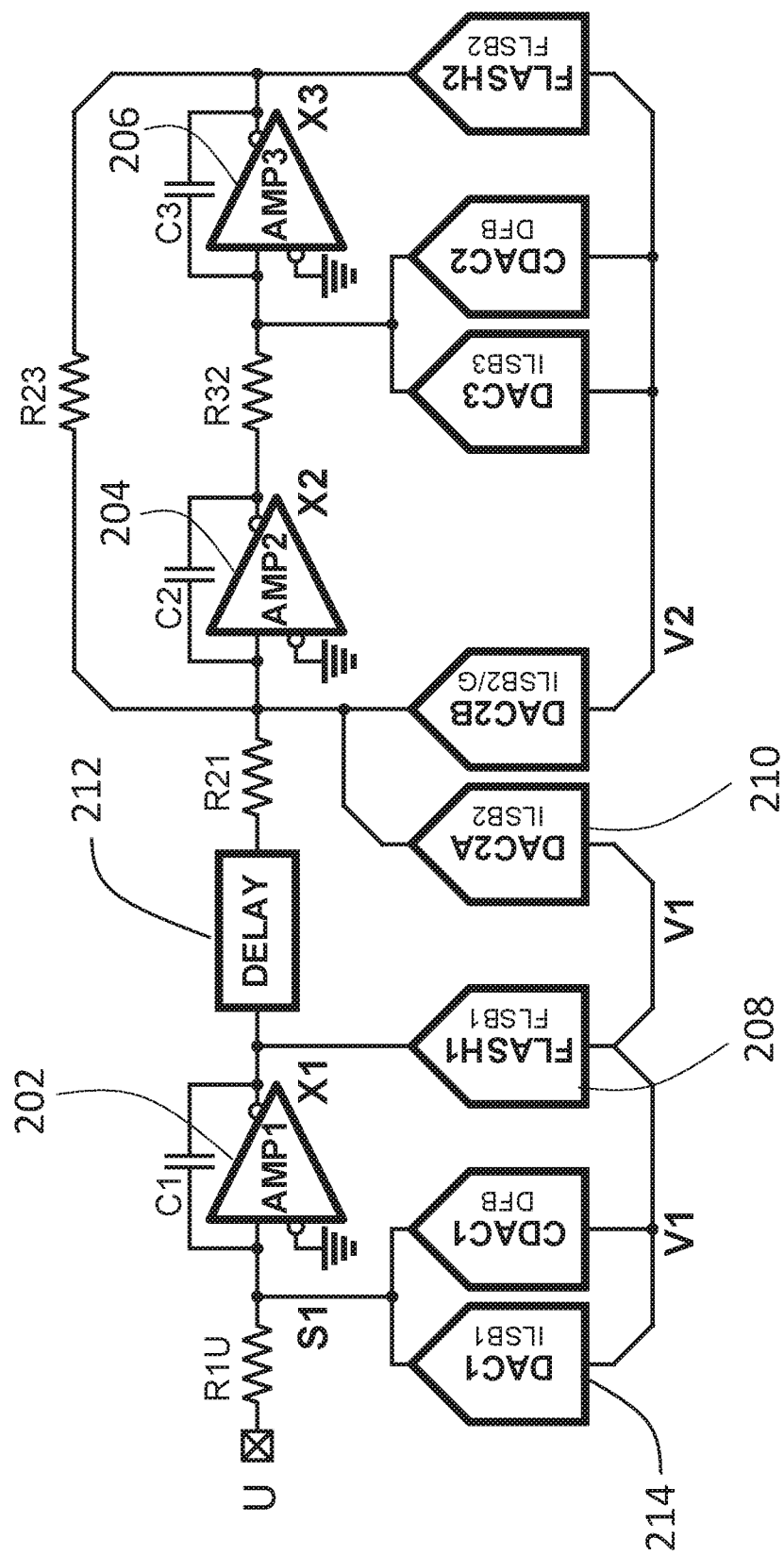
FIG. 2 is an illustrative system diagram of a 1-2 continuous time multi-stage delta sigma analog-to-digital converter (CT MASH ADC), according to some embodiments of the disclosure.

FIG. 2 is an illustrative system diagram of a 1-2 continuous time multi-stage delta sigma analog-to-digital converter (CT MASH ADC), according to some embodiments of the disclosure. In this example, the CT MASH ADC has two stages: a first order delta sigma modulator as the first stage (or front end), and a second order delta sigma modulator as the second stage (or back end). The first stage (or front end) generates a first digital output V1. The second stage (or back end) generates a second digital output V2. The order of the delta sigma modulator is determined by the number of integrators (number of feedback loops) in the stage. The first stage (front end) has only one integrator (e.g., integrator having opamp AMP1 202 generating output signal X1), thus it is a first order modulator. The second stage (back end) has two integrators (e.g., integrator having amplifier opamp AMP2 204 generating output X2, and integrator having opamp AMP3 206 generating output X3), thus it is a second order modulator. While this example is a 1-2 CT MASH ADC, the present disclosure is applicable to a variety of converters having the feedback DAC, including other CT MASH ADC architectures, discrete time (DT) MASH ADC architectures, hybrid CT-DT MASH ADC architectures, and CT, DT, or hybrid CT-DT pipeline modulators, successive approximation register (SAR) ADC architectures, and other ADC architectures having a feedback DAC whose errors affect the overall performance of the converter.

Referring back to FIG. 2, the residue of the coarse quantization provided by the flash quantizer ("FLASH1" 208) inside the first order front end is fed to the second order back end and gets digitized by the second order back end. The output of the integrator in the first order front end (or input to the flash quantizer FLASH1 208), X1, is digitized by FLASH1 208 to generate digital output V1. Digital output V1 is provided as input to DAC "DAC2A" 210 to generate an analog output signal. The difference between X1 (or a delayed version of X1 at the output of the delay block 212) and the DAC2A 210 analog output yields the residue of the coarse quantization. The delay element 212 can be provided match possible transconductance and group delay of a signal path used for generating the DAC2A 210 analog output, i.e., the path through FLASH1 208 and DAC2A 210. The digital output of the front end V1 and the digital output of the back end V2 are properly combined in digital domain as the final digital word of the 1-2 CT MASH ADC. The nonlinearity of the feedback DAC(s), i.e. static mismatch, timing mismatch error (sometimes referred to as timing error) and switching error (sometimes called switching mismatch error or duty cycle error), will introduce harmonic distortions in the modulator. In particular, the performance of the feedback DAC "DAC1" 214 in FIG. 2 inside the first stage (the front end) is critical to the performance of the entire MASH ADC. Careful and deliberate analog circuit design and planning can improve the performance of the feedback DAC1, but in practice, the feedback DAC1 214 would still have some error.

Understanding Timing Mismatch Error of the Feedback DAC

Timing mismatch error is created by the timing skew difference among DAC elements. FIG. 3A shows two current steering DAC elements, current steering DAC element 302 and current steering DAC element 304 having timing path difference or timing skew difference, according to some embodiments of the disclosure. A current steering DAC element has a current source (denoted as "I" in the figure) and may have two switches (shown as transistors) coupled to the current source for steering the current. The switches are controlled by corresponding bit of the input data D[k] to steer the current. The bit can control whether the current is steered towards the left output (denoted as "l") or the right output (denoted as "r") of the corresponding DAC element. Current output of the current steering DAC element 302 is represented by $i_0$. Current output of the current steering DAC element 304 is represented by $i_1$. The circuit in the current steering DAC element ensures that exactly one of the two switches turns on to steer the current I based on the input bit D[k]. The turning on of the switches is clocked by clock signal CLK, which is provided to each DAC element. The timing skew $\Delta t$ between two current steering DAC elements, are introduced mainly by clock path mismatches and asymmetries, i.e., the CLK signal experiences different latencies as they arrive at the DAC elements. As a result, the charge or current being delivered to the respective outputs of the DAC elements, shown as $i_0$ and $i_1$ for DAC elements 302 and 304 respectively, are mismatched due to the timing skew of the clock signal CLK arriving at the DAC elements.

FIG. 3B illustrates error charges e(t) delivered due to timing skew, according to some embodiments of the disclosure. Different DAC elements can deliver different charges at a given time due to different clock timing. For the two DAC elements of the example in FIG. 3A, the timing skew in the clock signals results in non-ideal currents at the outputs, shown as $i_0$ and $i_1$ for DAC elements 302 and 304 respectively. The error charge e(t) appears due to the non-ideal output currents, $i_0$ and $i_1$, when the changes in the respective current outputs are not aligned in time.

The total delivered charge by the DAC (having both DAC elements) would be signal dependent, which can introduce harmonic distortions. The timing mismatch among DAC elements becomes more significant for high speed continuous-time delta sigma modulators, since the errors created from timing mismatch is a bigger portion of the entire charge in one clock cycle as the clock gets faster. Due to timing mismatch error, the Signal-to-Noise-and-Distortion Ratio (SNDR) and spurious free dynamic range (SFDR) performances of the modulator can be greatly deteriorated. Therefore, for high speed multi-bit continuous-time delta sigma modulator, the correction of the timing mismatch error among the DAC elements to achieve high linearity is one of the most critical design issues.

DAC Element Timing Mismatch Error Measurement and Calibration Mechanism

Figure 4:
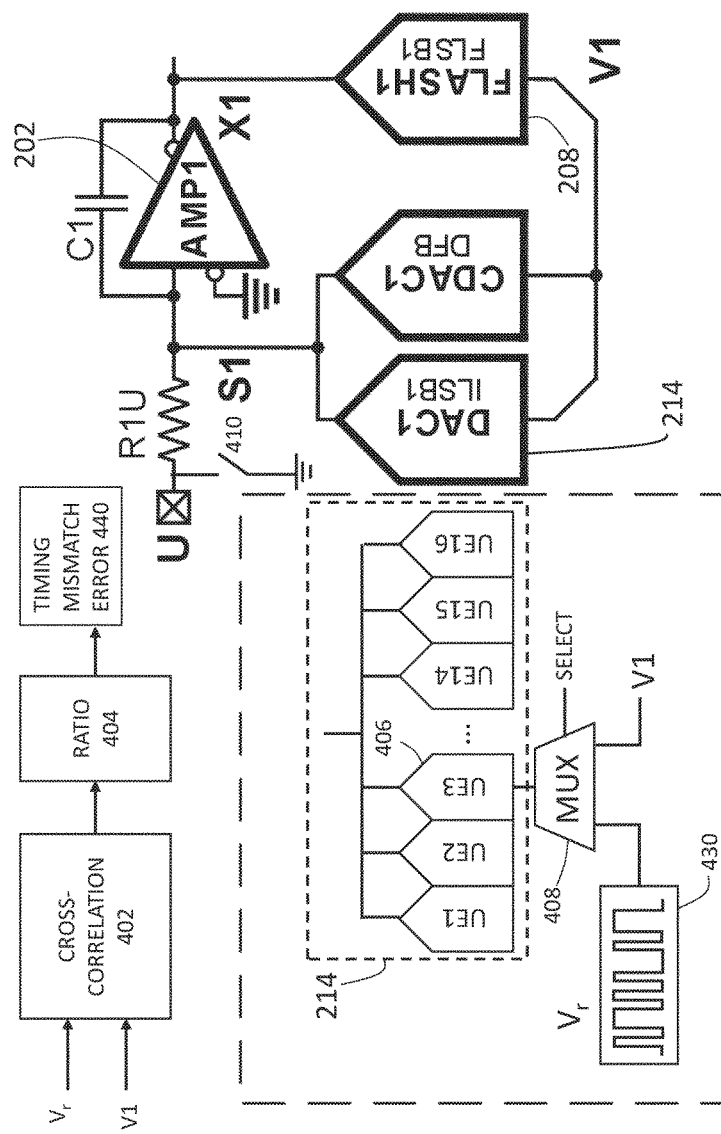
FIG. 4 shows a block diagram of the timing mismatch error measurement scheme, according to some embodiments of the disclosure.

FIG. 4 shows a block diagram of the timing mismatch error measurement scheme, according to some embodiments of the disclosure. As an example, FIG. 4 shows a continuous-time multi-bit delta sigma modulator (CT multi-bit DS modulator) following the architecture illustrated in FIG. 1, and this CT multi-bit DS modulator can be a front end or first stage in the multi-stage ADC seen in FIG. 2. The modulator can receive a voltage input U, which is converted into a current by resistor "R1U" at node S1. The modulator has an integrator having opamp "AMP1" 202 integrating the signal at node S1 and generating output signal X1. X1 is provided to flash quantizer "FLASH1" 208 to be digitized. The modulator has a digital output signal V1 at the output of FLASH1 208. The CT multi-bit DS modulator has a multi-bit DAC1 in the feedback loop (shown as feedback DAC "DAC1" 214). The input to feedback DAC "DAC1" 214 receives the digital output V1, and the output of the feedback DAC DAC1 214 is coupled or fed back to the analog input of the modulator (node S1). The multi-bit DS modulator can be standalone ADC, a part of a MASH ADC, or a part of a multi-stage ADC. This example is not meant to be limited to a CT multi-bit DS modulator, but is meant to illustrate how to measure the timing mismatch error of a feedback DAC in a variety of ADC architectures with a feedback loop configuration. A capacitor DAC "CDAC1" is provided to stabilize the feedback loop, and is not pertinent to the schemes described herein.

The quantizer "FLASH1" 208 output V1 can be thermometer coded, and the feedback DAC "DAC1" 214 can be a unit-element based where all the DAC elements (unit elements) in the feedback DAC have (ideally) the same weight. The "bits" or "parts" of the thermometer coded output V1 can control respective unit elements in the feedback DAC "DAC1" 214. In this example, as seen in the FIGURE, a 17-level mid-tread DAC using 16 elements (labeled as UE1, UE2, UE3 . . . UE14, UE15 and UE16) is depicted for feedback DAC "DAC1" 214. Other DAC architectures where timing mismatch errors are present are envisioned by the disclosure. Based on a corresponding "bit" or "part" in the digital input V1, a DAC element, in this case, a complementary DAC element, provides a feedback current of either $+I_{LSB}$ or $-I_{LSB}$ at the output S1 (in a fashion similar the DAC elements 302 and 304 in FIG. 3A). Herein, the DAC element is treated dimensionless, and its nominal value is either +1 or −1. In this example, the full scale output range of the feedback DAC is from −16 to +16 with least significant bit LSB of +2. In an ideal modulator with shorted input, each one of the DAC elements, UE1 to UE8, will be −1, and each one of the DAC elements, UE9 to UE16, will be +1, therefore the sum of all the DAC elements are 0, which equals to the (shorted) input. Different combination of +1's and −1's generated by the DAC elements, as dictated by the digital output V1, allows a variable output to be generated by the DAC and said variable output is fed back to node S1.

To illustrate the measurement of timing mismatch error, FIG. 4 shows unit element UE3 406 being the DAC element under test whose timing mismatch error is to be measured. The same scheme can be used to measure the timing mismatch error of other elements of the DAC. The timing mismatch error for a particular DAC element, e.g., UE3 406, is measured by applying a pseudo random dither signal $V_r$ to the input of the particular DAC element, and performing cross-correlation between the modulator output V1 (when the pseudo random dither signal $V_r$ is being applied) and pseudo random dither signal $V_r$, with the input of the modulator shorted. Cross-correlation is a sliding dot product or sliding inner-product of the two digital signals: pseudo random dither signal $V_r$ and the digital output of the modulator V1. The unit element, similar to the current steering DAC elements seen in FIG. 3A, can generate an output of +1 or −1, depending on the logic level of the pseudo random dither signal.

The input can be shorted to ground=0 (zero potential) by controlling a switch 410, e.g., using a control signal, to couple the input node U to ground (closing switch "G" to short the input to the ADC to ground), or performing equivalent operations(s) to provide a zero voltage potential signal as the input to the modulator. The element under test is outputting +1 or −1 depending on the logic level of the pseudo-random signal. Shorting the input to ground forces the rest of the elements not under test to react to the pseudo-random signal toggling of the element under test, making sure all the elements sum to zero, since the loop ensures that the output of the quantizer V1 to follow the input U. Viewed differently, the rest of the DAC elements not under test (whose input is tied to receive the output of the quantizer V1) are being used to measure the timing mismatch error of the DAC element under test.

Note that the delta-sigma modulator itself, i.e., the feedback loop, is used to measure the timing mismatch error for the particular DAC element. The random dither signal can be a randomized sequence of bits, i.e., having logic level of 1's and 0's. The assumption is that information associated with any timing mismatch error of the element under test would appear at the output of the feedback DAC at node S1 as the element under test is being actuated by the pseudo random dither signal. Due to the feedback loop configuration, the delta-sigma modulator can digitize the output of the feedback DAC 214, which means that the timing mismatch error would appear at the digital output of the modulator V1. The cross-correlation of $V_r$ and the digital output of the modulator V1 would help reveal the information associated with any timing mismatch error of any DAC element under test.

As illustrated in FIG. 4, a selector, such as multiplexer 408 (shown as "MUX"), can select either the random dither signal $V_r$ or the corresponding bit in the flash output V1 being applied to the particular DAC element, e.g., in response to a "SELECT" signal. The "SELECT" signal can put the feedback DAC, or more specifically, the DAC element under test, to be in a calibration mode. For example, when calibrating the DAC element "UE3" 406, the input of UE3 406 is multiplexed to receive the random signal $V_r$, while the rest of the elements (e.g., 15 elements of the total of 16 elements) are connected to their corresponding bits in the flash output V1. A multiplexer such as multiplexer 408 or other suitable selection means can be provided for each DAC element whose timing mismatch error is to be measured. In some embodiments, the selection means can include selection circuitry for applying either the pseudo random dither signal or a corresponding part or bit of the digital output of the ADC (e.g., V1) to the input of the element under test (e.g., UE3 406).

Figure 5:
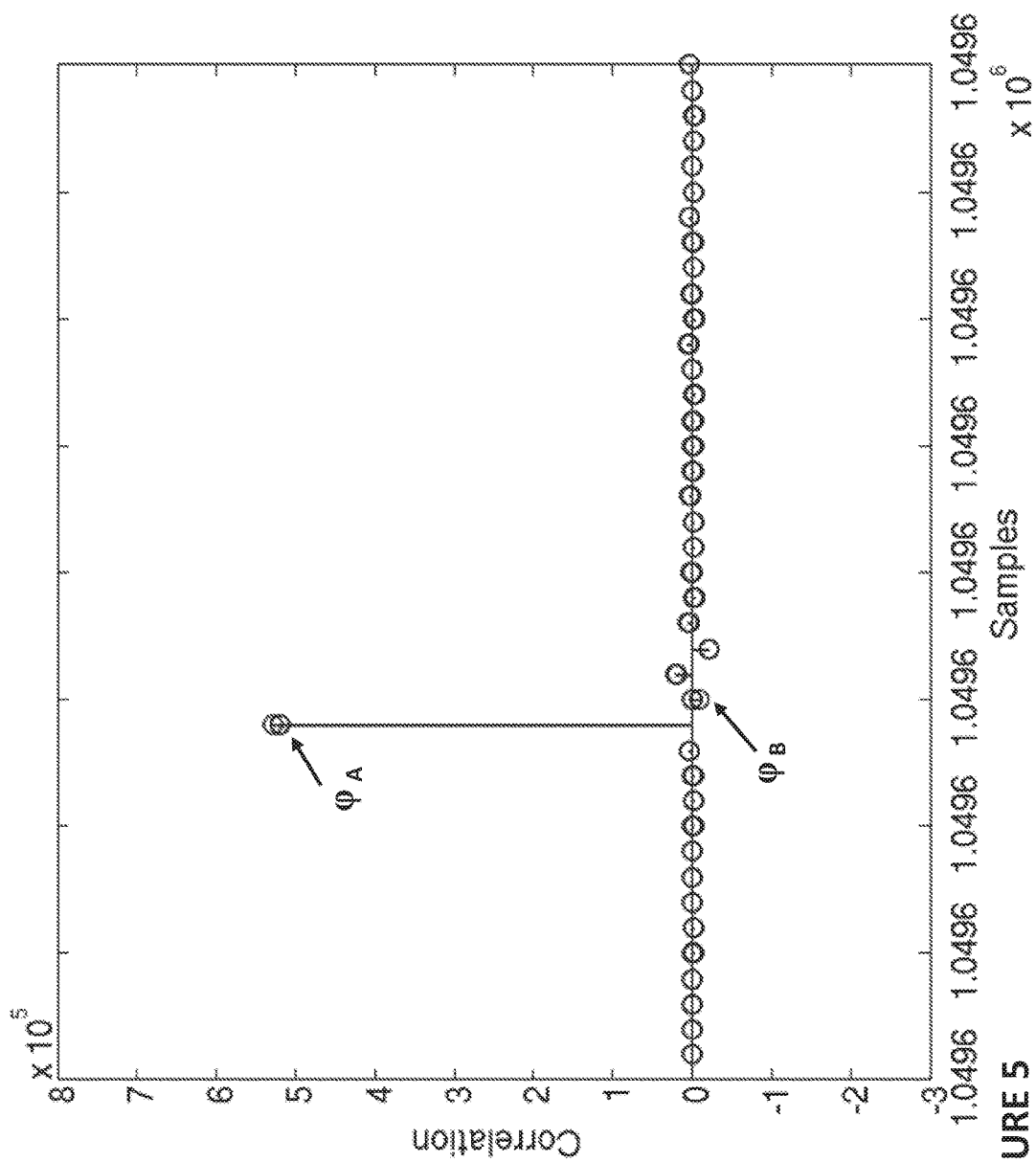
FIG. 5 shows a plot of the cross-correlation of V1 with a first DAC element and the cross-correlation of V1 with a second DAC element, with the random dither signal applied to the first DAC element and the second DAC element respectively, according to some embodiments of the disclosure.

FIG. 5 shows a plot of the cross-correlation of V1 with a first DAC element and the cross-correlation of V1 with a second DAC element, with the random dither signal applied to the first DAC element and the second DAC element respectively, according to some embodiments of the disclosure. The cross-correlation plot is zoomed in around the area where the correlation exhibits a peak. The two cross-correlations for the first DAC element and the second DAC element are superimposed on the same plot, and it can be seen that for some of the taps, the cross-correlation values are different. If the timing mismatch errors of the DAC elements are different, the cross-correlation plots, i.e., the cross-correlation values, would be different for the DAC elements. The timing mismatch error of each element is then estimated by the ratio of $\phi_B/(\phi_A+\phi_B)$, where $\phi_A$ is the peak value of the cross-correlation function, while $\phi_B$ is the value for the next/adjacent tap of the cross-correlation function. In words, the ratio is $\phi_B$ divided by the sum of $\phi_A$ and $\phi_B$. The rest of the DAC element timing mismatch errors can be measured in the same fashion.

Referring back to FIG. 4, a cross-correlation block 402 having cross-correlation circuitry can be included to perform a cross-correlation of pseudo random dither signal $V_r$ and the modulator output V1. In some embodiments, the cross correlation block 402 can perform a cross-correlation of a pseudo random dither signal applied to an input of an element in a feedback digital to analog converter (DAC), such as UE3 406, and a digital output of an analog to digital converter (ADC) having the feedback DAC, such as digital output V1. The cross-correlation block 402 can generate values seen in the plot of FIG. 5. In some cases, dedicated hardware circuitry can be implemented to perform cross-correlation. In some cases, the pseudo random dither signal $V_r$ and the modulator output V1 are stored in a buffer, and digital signal processing circuitry such as an on-chip processor can execute instructions to compute cross-correlation based on the values stored in the buffer. The buffer can store samples of the pseudo random dither signal and samples of digital output of the ADC collected when the pseudo random dither signal is applied to the input of the element under test.

In some embodiments, a pseudo random number generator 430 (or pseudo random dither signal generator) is included for providing a pseudo randomized sequence of bits as the pseudo random dither signal. The pseudo randomized sequence of bits may be generated on the fly, or the pseudo randomized sequence of bits may be pre-generated and retrieved from a memory element.

A ratio function block 404 can be included to determine the ratio $\phi_B/(\phi_A+\phi_B)$ based on the cross-correlation determined by the cross-correlation block 402. In some embodiments, a ratio function block 404 can determine timing mismatch error based on a ratio defined by a peak value and a value of a tap adjacent to the peak value. The ratio is defined between the value of the tap adjacent to the peak value and a sum of the peak value and the value of the tap adjacent to the peak value.

In some examples, $2^{20}$ cross-correlation points are used for estimating the timing mismatch error. More cross-correlation points can improve the timing mismatch error estimation accuracy. Timing mismatch error block 440 having suitable storage circuitry or a look up table can be included for storing timing mismatch errors determined from ratios determined by the ratio block for a plurality of DAC elements in the feedback DAC. Timing mismatch error block 440 may be accessible by the modulator or ADC so that calibration or correction of the timing mismatch errors can be carried out. Programmable impedance blocks, e.g., capacitor arrays (programmable or configurable), can be included for timing skew calibration based on the timing mismatch errors. The impedance blocks can be coupled to the clock signal paths or the output signal paths of the DAC elements.

Figure 6:
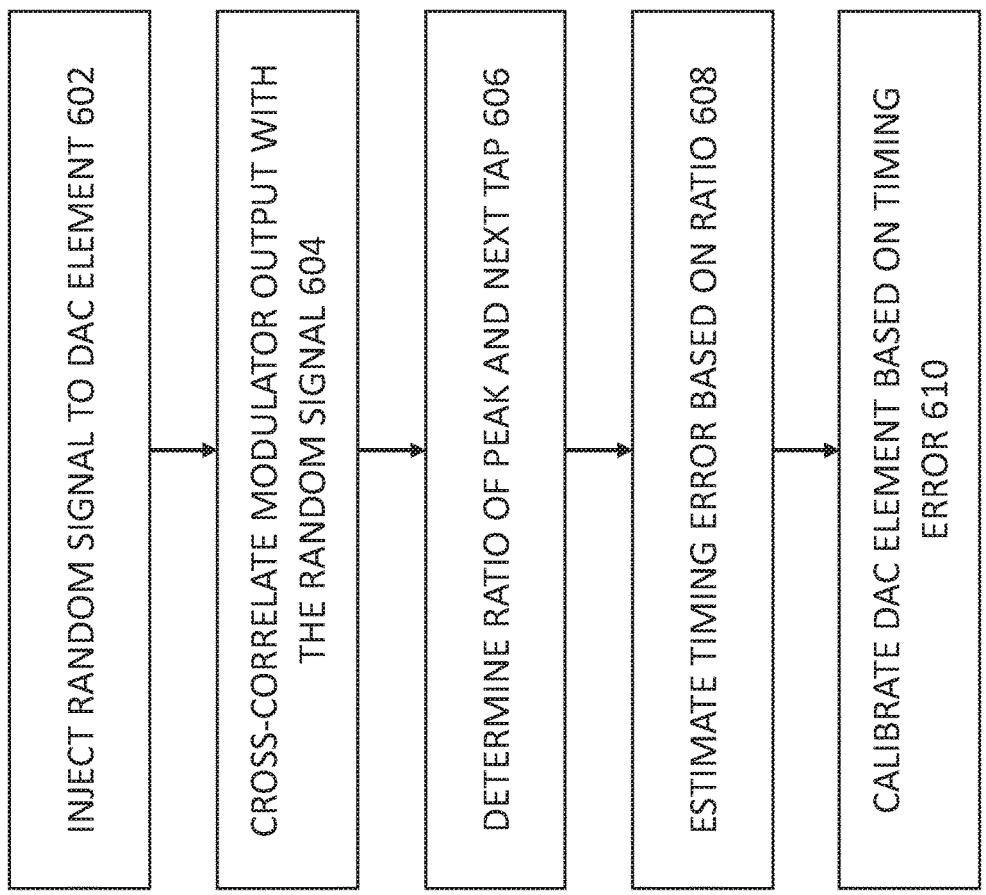
FIG. 6 is a flow diagram illustrating a method for digitally estimating and calibrating timing mismatch error of a DAC element, according to some embodiments of the disclosure.

Method for Measuring and Calibrating the Timing Mismatch Error of the DAC Element FIG. 6 is a flow diagram illustrating a method for digitally estimating and calibrating timing mismatch error of a DAC element, according to some embodiments of the disclosure. The method outlined is described for a particular DAC element. It is envisioned by the disclosure that the same method can be applied to other DAC elements in the multi-bit feedback DAC to measure the timing mismatch error of the rest of the DAC elements. In 602, a random signal (dither signal) is injected to an input of the particular DAC element (DAC element under test) of a feedback DAC in a delta-sigma modulator. A multiplexer can be used to select the random signal (versus the regular flash output corresponding to the DAC element under test). The rest of the DAC elements not under test has the corresponding flash outputs as their input. In 604, a cross-correlation is performed between the modulator output and the random signal, over many samples while or when the random signal is applied to the DAC element under test. In 606, the ratio of $\phi_B/(\phi_A+\phi_B)$, where $\phi_A$ is the peak value of the cross-correlation function, while $\phi_B$ is the value for the next/adjacent tap of the cross-correlation function, is determined. In 608, the timing mismatch error is estimated based on the ratio. In some cases, the timing mismatch error is represented by the ratio. The timing mismatch errors can be stored in a look-up table and corrected in the digital domain or analog domain. In 610, the DAC element under test can be calibrated based on the timing mismatch error.

Example: Deriving the Timing Mismatch Error Based on Cross-Correlation

Figure 7:
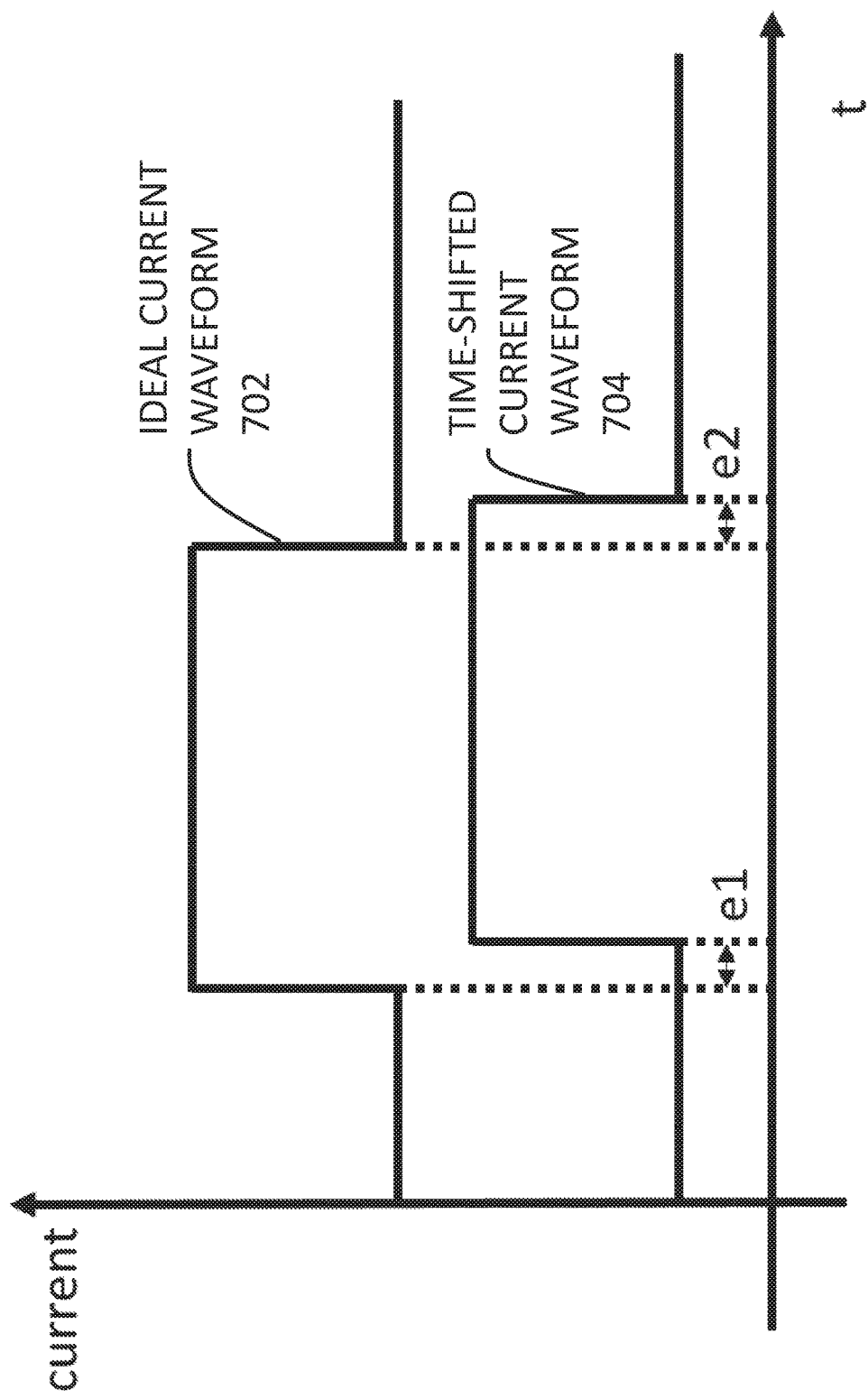
FIG. 7 is a plot of an ideal DAC unit element output current waveform and a time shifted DAC element output current waveform, according to some embodiments of the disclosure.

FIG. 7 is a plot of an ideal DAC unit element output current waveform 702 and a time shifted DAC element output current waveform 704, according to some embodiments of the disclosure. It can be see that the time shifted DAC element output current waveform has a time mismatch e1 at the rising edge and has a timing mismatch e2 at the falling edge. For simplicity, it is assumed that e1 and e2 are equal to each other. The output of the time shifted DAC element output can be represented by:

$$dout(t) = \sum_{n=-\infty}^{+\infty} d_c(nT)[u(t-nT-e1) - u(t-nT-T-e2)]$$

$d_c(nT)$ is the DAC input value at t=nT instance, and u(t) is a unit step function. The Laplace transform of dout(t) is then:

$$dout(s) = \sum_{n=-\infty}^{+\infty} d_c(nT)\left[\frac{e^{-s(nT+e1)}}{s} - \frac{e^{-s(nT+T+e2)}}{s}\right] = \frac{e^{-se1} - e^{-s(T+e2)}}{s} \sum_{n=-\infty}^{+\infty} d_c(nT)e^{-snT}$$

Considering e1=e2 and $$e^x = 1 + x + \left(\frac{x^2}{2}\right) + \dots,$$

the equation above can be simplified to:

$$dout(s) = \frac{e^{-se1}(1-e^{-sT})}{s} \sum_{n=-\infty}^{+\infty} d_c(nT)e^{-snT} \approx \frac{(1-se1)(1-e^{-sT})}{s} \sum_{n=-\infty}^{+\infty} d_c(nT)e^{-snT}$$

Note that $(1-se1)=1-(1-Z^{-1})e1=1-e1+e1Z^{-1}$. Due to the timing shift, in the first period the charge delivered is e1 less than it should be, and the error e1 is delivered into the next period. Above equation can be expressed in discrete time as:

$$d\text{out}(n)=(1-e1+\delta(n-1)e1)d_c(n)$$

The cross-correlation of the output dout(n) to the input $d_c(n)$ is:

$$r_{xx}(l) = (1-e1+\delta(n-1)e1)\sum_{n=-\infty}^{+\infty} d_c(n-l)d_c(n), l = 0, \pm1, \pm2 \ldots$$

Since pseudo random dither signal $d_c(n)$ is a pseudo-random signal, the autocorrelation is 1 when the lag is zero (when l is zero):

$$\sum_{n=-\infty}^{+\infty} d_c(n-l)d_c(n) = \begin{cases} 1, & \text{when } l = 0 \\ 0, & \text{when } l \neq 0 \end{cases}$$

The cross-correlation of the pseudo-random dither signal and the output is then:

$$r_{xx}(l) = \begin{cases} 1-e1, & \text{when } l = 0 \\ e1, & \text{when } l = 1 \end{cases}$$

For the above cross-correlation function, the peak value is 1−e1, and the value for the next tap is e1. The ratio represents the timing mismatch error can be computed using the peak value $\phi_A=1-e1$ and the value for the next tap $\phi_B=e1$, wherein the ratio $\phi_B/(\phi_A+\phi_B)$ equals to e1/(1−e1+e1)=e1. Based on this example, it can be appreciated that the timing mismatch error of the DAC element under test can be estimated from the ratio.

Exemplary Method for Measuring Timing Mismatch Error

Figure 8:
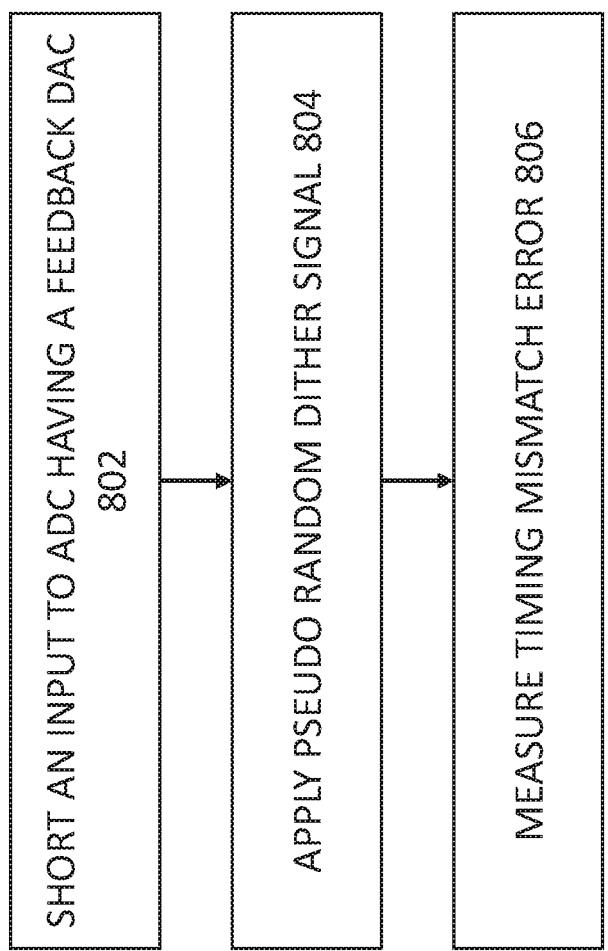
FIG. 8 is a flow diagram illustrating a method for measuring timing mismatch error of a DAC element, according to some embodiments of the disclosure.

FIG. 8 is a flow diagram illustrating a method for measuring timing mismatch error of a DAC element, according to some embodiments of the disclosure. The method is used for an ADC having a feedback loop configuration. The ADC has a feedback DAC, which has an output which is coupled to an analog input of the ADC and an input which is coupled to a digital output of the ADC. In 802, the input to the ADC is shorted to ground. In 804, a pseudo random dither signal is applied to an input of an element under test of a feedback DAC. The pseudo random dither signal can be a pseudo randomized sequence of bits. While or when the pseudo random dither signal is applied to the input of the element under test, the digital output of the ADC is applied to other elements of the feedback DAC. As explained in relation to FIGS. 4-7, the rest of the DAC elements of the feedback DAC and the loop itself is used to measure the timing mismatch error of the DAC element under test.

In 806, a timing mismatch error of the element under test of feedback digital to analog converter is measured by determining a cross-correlation between the pseudo random dither signal and a digital output of the ADC. Measuring the timing mismatch error further comprises determining the timing mismatch error based on a peak value and a value of a tap next to the peak value of the cross-correlation. Measuring the timing mismatch error can further include determining a ratio of a value of a tap next to a peak value of the cross-correlation to a sum of the peak value and the value of the tap next to the peak value. The applying and the measuring (804 and 806) can be repeated for another element under test of the feedback DAC.

Exemplary Apparatus Having Analog to Digital Conversion and Timing Mismatch Error Estimation for the Feedback ADC In some embodiments, the apparatus includes a quantizer for digitizing an analog input and generating a digital output, and a feedback DAC (DAC) receiving the digital output as input and providing a feedback signal to the analog input. The apparatus can be a continuous-time delta-sigma modulator in a multi-stage delta sigma analog-to-digital converter (e.g., seen in FIGS. 2 and 4), but the apparatus can be other ADCs having a feedback DAC. The timing mismatch error estimation scheme is particularly beneficial to ADCs where the errors from the feedback DAC needs to be reduced (or that the errors cannot be shaped away).

The apparatus includes means for applying a pseudo random dither signal to a DAC element under test of the feedback DAC while rest of the DAC elements of the feedback DAC receives the digital output. The means can include the selection circuitry described herein, such as a multiplexer. The apparatus further includes means for performing cross-correlation the pseudo random dither signal with the digital output and means for determining timing mismatch error from the cross-correlation. Means for determining timing mismatch error from the cross-correlation comprises means for determining a sliding dot product of the pseudo random dither signal and the digital output. The means for determining timing mismatch can further include means for determining a peak value of the cross-correlation and a value of a tap adjacent to the peak value, and means for determining a ratio of the value of the tap adjacent to the peak value to a sum of the peak value and the value of the tap adjacent to the peak value. The procedures for cross-correlation operation and timing mismatch error estimation are illustrated by, e.g., FIG. 7 and the accompanying description. The apparatus can further include digital and/or analog means for calibrating (or correcting) the feedback DAC based on timing mismatch error.

EXAMPLES

Example 1 is a method for measuring timing mismatch error, comprising: applying a pseudo random dither signal to an input of an element under test of a feedback digital to analog converter (DAC), wherein the feedback DAC has an output which is coupled to an analog input of an analog to digital converter (ADC) having a feedback loop configuration and an input which is coupled to a digital output of the ADC; determining a cross-correlation between the pseudo random dither signal and the digital output of the ADC; and determining a timing mismatch error associated with the element under test of the feedback digital to analog converter based on the cross-correlation.

In Example 2, Example 1 can further comprise shorting the analog input to the ADC to ground.

In Example 3, any one of the above Examples can include the pseudo random dither signal being a pseudo randomized sequence of bits.

In Example 4, any one of the above Examples can include while the pseudo random dither signal is applied to the input of the element under test, the digital output of the ADC being applied to other elements of the feedback DAC.

In Example 5, any one of the above Examples can further include determining the timing mismatch error further comprising determining the timing mismatch error based on a peak value and a value of a tap next to the peak value of the cross-correlation.

In Example 6, any one of the above Examples can further include determining the timing mismatch error further comprising determining a ratio of (1) a value of a tap next to a peak value of the cross-correlation to (2) a sum of the peak value and the value of the tap next to the peak value.

In Example 7, any one of the above Examples can further include repeating the applying and the measuring for another element under test of the feedback DAC.

Example 8 is a circuit for measuring timing mismatch, comprising: a cross correlation block for performing a cross-correlation of a pseudo random dither signal applied to an input of an element in a feedback digital to analog converter (DAC) and a digital output of an analog to digital converter (ADC) having the feedback DAC; and a ratio function block for determining timing mismatch error based on a ratio defined by a peak value in a cross-correlation function determined by the cross-correlation block and a value of a tap in the cross-correlation function adjacent to the peak value.

In Example 9, any one of the above Examples can further include a buffer for storing samples of the pseudo random dither signal and samples of digital output of the ADC collected when (or samples taken while) the pseudo random dither signal is applied to the input of the element under test.

In Example 10, any one of the above Examples can further include selection circuitry for applying either the pseudo random dither signal or a corresponding part of the digital output of the ADC to the input of the element under test.

In Example 11, any one of the above Examples can further include the ratio is defined as a ratio of (1) the value of the tap adjacent to the peak value to (2) a sum of the peak value and the value of the tap adjacent to the peak value.

In Example 12, any one of the above Examples can further include a look up table for storing timing mismatch errors determined from ratios determined by the ratio block for a plurality of DAC elements in the feedback DAC.

In Example 13, any one of the above Examples can further include a switch for shorting an analog input to the ADC to ground.

In Example 14, any one of the above Examples can further include a pseudo random number generator for providing a pseudo randomized sequence of bits as the pseudo random dither signal.

Example 15 is an apparatus comprising: a quantizer for digitizing an analog input and generating a digital output; a feedback digital to analog converter (DAC) receiving the digital output as input and providing a feedback signal to the analog input; means for applying a pseudo random dither signal to a DAC element under test of the feedback DAC while a remainder of the DAC elements of the feedback DAC receives the digital output; means for determining a cross-correlation the pseudo random dither signal with the digital output; and means for determining timing mismatch error from the cross-correlation.

In Example 16, any one of the above Examples can further include means for calibrating the feedback DAC based on timing mismatch error.

In Example 17, any one of the above Examples can further include means for determining timing mismatch error from the cross-correlation comprising means for determining a sliding dot product of the pseudo random dither signal and the digital output.

In Example 18, any one of the above Examples can further include means for determining timing mismatch error from the cross-correlation comprising means for determining a peak value of the cross-correlation and a value of a tap in the cross correlation adjacent to the peak value.

In Example 19, any one of the above Examples can further include means for determining timing mismatch error from the cross-correlation further comprising means for determining a ratio of the value of the tap adjacent to the peak value and a sum of the peak value and the value of the tap adjacent to the peak value.

In Example 20, any one of the above Examples can further include the apparatus being a continuous-time delta-sigma modulator in a multi-stage delta sigma analog-to-digital converter. In some embodiments, the apparatus is a CT pipeline ADC.

Other Implementation Notes, Variations, and Applications

The width of radio frequency (RF) bands commonly used for cellular telecommunications has grown from 35-75 MHz for 2G/3G/4G platforms to 100-200 MHz for today's Long Term Evolution (LTE) and the desire for relaxed image rejection filtering has pushed the direct intermediate frequency (IF) sampling frequencies to 300+MHz. In some embodiments, the digital measurement and calibration features can be used in a continuous-time (CT) multi-stage noise-shaping (MASH) ADC integrated circuit which achieves 69 dB of DR over a 465 MHz signal bandwidth with a combined power consumption of 930 mW from ±1.0V/1.8V supplies. The ADC integrated circuit can be implemented in 28 nm CMOS and achieves a peak SNDR of 64 dB, a small-signal noise-spectral density (NSD) of −156 dBFS/Hz, and a figure-of-merit (FOM) of 156 dB over a signal bandwidth of 465 MHz. With an 8 GHz sample rate and a signal bandwidth of 465 MHz, the oversampling ratio (OSR) is 8.6. A 1-2 MASH architecture can be chosen to achieve aggressive noise-shaping at a low OSR. The use of low-order sub-loops also contributes to the robustness of the overall ADC. The first stage can be a first-order modulator to minimize the power of amplifiers for a given thermal noise requirement under a low OSR scenario. The first stage can include an active-RC integrator, a 17-level flash ADC (FLASH1), a current-steering DAC (IDAC1), and a capacitive-DAC (CDAC1). CDAC1 implements a fast direct-feedback (DFB) loop to compensate for the excess loop delay associated with the chosen FLASH-IDAC timing. A differential 200Ω R1U and a 625 uA IDAC1 LSB can set a 2V differential p–p input full-scale. A dither block adds a 1-bit 1/2-LSB dither signal to the output of FLASH1. The quantization residue of the first-stage is injected into the second-stage via R21 and current-steering DAC (IDAC2A). R21 is implemented as an all-pass RC lattice filter to provide both accurate transconductance and a group delay that approximately matches the delay through the FLASH1-IDAC2A path. The residue current is then digitized by the second-order second stage. The second stage consists of an active-RC resonator, a 17-level flash ADC (FLASH2), current steering DACs (IDAC2B and IDAC3), and a capacitive-DAC (CDAC2) used to provide a DFB loop. The second stage uses a feedback topology to minimize STF peaking and the input full-scale of the second stage is scaled down to provide an inter-stage gain of six to minimize the overall quantization noise floor while preventing the residue of the first stage from saturating the second stage. The digital outputs of both stages, V1 and V2, are fed to the digital backend for further processing. A 10-tap programmable FIR filter (DNCF) can implement digital quantization noise cancellation and equalization after decimation (DEC) by a factor of four. DNCF coefficients can be generated using an off-chip LMS algorithm during an integrated start-up calibration phase.

While the embodiments described herein are described in relation to a delta sigma modulator having a feedback DAC, the method for measuring timing mismatch error of DAC elements can also be applied to other architectures, such as a feedback DAC inside pipeline ADC, a feedback DAC inside a successive-approximation register ADC, a feedback DAC in a continuous-time pipeline ADC. For a delta sigma modulator, the timing error from the unit element of under test in the feedback DAC can be measured using the other unit elements of the feedback DAC, since the other unit elements are readily available in the delta-sigma loop. For other types of ADC, such as the pipeline ADC, the timing error from the unit element under test of the feedback DAC of a given stage can be measured using the subsequent stages in the pipeline ADC in a similar fashion, and the timing error would appear in an output of the pipeline ADC.

The embodiments described herein can be applicable for correcting the feedback DAC timing mismatch errors in any one of the stages of a MASH ADC, including continuous-time MASH ADCs (which uses continuous-time circuits), discrete-time MASH ADCs (which uses switched-capacitor circuits), or a hybrid continuous-time and discrete-time MASH ADC. In some cases, the timing mismatch error of the DAC element measurement scheme can also be applied to stand-alone high speed DACs. Results show that the embodiments described herein can be an attractive calibration technique for high speed high performance low-pass as well as band-pass continuous-time delta sigma modulators, especially for high speed systems in the multi-GHz range with low over-sampling rate (OSR), where dynamic errors from the feedback DAC becomes more critical.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

The present architecture for DAC timing mismatch error measurement and calibration are particularly suitable for high speed, continuous-time, high precision applications where MASH ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related DAC timing mismatch error measurement and calibration, such as the processes shown in FIGS. 6 and 8, illustrate only some of the possible functions that may be executed by, or within, the system illustrated in FIG. 4. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for measuring timing mismatch error, comprising:
   applying a pseudo random dither signal to an input of an element under test of a feedback digital to analog converter (DAC), wherein the feedback DAC has an output which is coupled to an analog input of an analog to digital converter (ADC) having a feedback loop configuration and an input which is coupled to a digital output of the ADC;
   determining a cross-correlation between the pseudo random dither signal and the digital output of the ADC; and
   determining a timing mismatch error associated with the element under test of the feedback digital to analog converter based on the cross-correlation.

2. The method of claim 1, further comprising:
   shorting the analog input to the ADC to ground.

3. The method of claim 1, wherein the pseudo random dither signal is a pseudo randomized sequence of bits.

4. The method of claim 1, further comprising:
   while the pseudo random dither signal is applied to the input of the element under test, the digital output of the ADC is applied to other elements of the feedback DAC.

5. The method of claim 1, wherein determining the timing mismatch error further comprises determining the timing mismatch error based on a peak value and a value of a tap next to the peak value of the cross-correlation.

6. The method of claim 1, wherein determining the timing mismatch error further comprises determining a ratio of a value of a tap next to a peak value of the cross-correlation and a sum of the peak value and the value of the tap next to the peak value.

7. The method of claim 1, further comprising:
   repeating the applying and the measuring for another element under test of the feedback DAC.

8. A circuit for measuring timing mismatch, comprising:
   a cross correlation block for performing a cross-correlation of a pseudo random dither signal applied to an input of an element in a feedback digital to analog converter (DAC) and a digital output of an analog to digital converter (ADC) having the feedback DAC; and
   a ratio function block for determining timing mismatch error based on a ratio defined by a peak value in a cross-correlation function determined by the cross correlation block and a value of a tap in the cross-correlation function adjacent to the peak value.

9. The circuit of claim 8, further comprising:
   a buffer for storing samples of the pseudo random dither signal and samples of digital output of the ADC collected when the pseudo random dither signal is applied to the input of the element under test.

10. The circuit of claim 8, further comprising:
    selection circuitry for applying either the pseudo random dither signal or a corresponding part of the digital output of the ADC to the input of the element under test.

11. The circuit of claim 8, wherein the ratio is defined as a ratio of the value of the tap adjacent to the peak value to a sum of the peak value and the value of the tap adjacent to the peak value.

12. The circuit of claim 8, further comprising:
    a look up table for storing timing mismatch errors determined from ratios determined by the ratio function block for a plurality of DAC elements in the feedback DAC.

13. The circuit of claim 8, further comprising:
    a switch for shorting an analog input to the ADC to ground.

14. The circuit of claim 8, further comprising:
    a pseudo random number generator for providing a pseudo randomized sequence of bits as the pseudo random dither signal.

15. An apparatus comprising:
    a quantizer for digitizing an analog input and generating a digital output;
    a feedback digital to analog converter (DAC) receiving the digital output as input and providing a feedback signal to the analog input;
    means for applying a pseudo random dither signal to a DAC element under test of the feedback DAC while a remainder of DAC elements of the feedback DAC receives the digital output;
    means for determining a cross-correlation between the pseudo random dither signal with the digital output; and
    means for determining timing mismatch error from the cross-correlation.

16. The apparatus of claim 15, further comprising:
    means for calibrating the feedback DAC based on timing mismatch error.

17. The apparatus of claim 15, wherein means for determining timing mismatch error from the cross-correlation comprises:
    means for determining a sliding dot product of the pseudo random dither signal and the digital output.

18. The apparatus of claim 15, wherein means for determining timing mismatch error from the cross-correlation comprises:
    means for determining a peak value of the cross-correlation and a value of a tap in the cross-correlation adjacent to the peak value.

19. The apparatus of claim 18, wherein means for determining timing mismatch error from the cross-correlation further comprises:
    means for determining a ratio of the value of the tap adjacent to the peak value to a sum of the peak value and the value of the tap adjacent to the peak value.

20. The apparatus of claim 15, wherein the apparatus is a continuous-time delta-sigma modulator in a multi-stage delta sigma analog-to-digital converter.

\* \* \* \* \*